(12) United States Patent
Hashimoto et al.

(10) Patent No.: US 12,656,678 B2
(45) Date of Patent: Jun. 16, 2026

(54) IMPRINTING METHOD AND MANUFACTURING METHOD

(71) Applicant: CANON KABUSHIKI KAISHA, Tokyo (JP)

(72) Inventors: Tsutomu Hashimoto, Utsunomiya (JP); Kiyohito Yamamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 817 days.

(21) Appl. No.: 17/733,253

(22) Filed: Apr. 29, 2022

(65) Prior Publication Data

US 2022/0260905 A1 Aug. 18, 2022

Related U.S. Application Data

(62) Division of application No. 16/279,676, filed on Feb. 19, 2019, now abandoned.

(30) Foreign Application Priority Data

Feb. 28, 2018 (JP) ................................. 2018-035311

(51) Int. Cl.
  *G03F 7/00* (2006.01)
(52) U.S. Cl.
  CPC .................................. *G03F 7/0002* (2013.01)
(58) Field of Classification Search
  CPC .... G03F 7/0002; G03F 7/0017; G03F 7/2041; G03F 7/707; G03F 7/70958
  See application file for complete search history.

(56) References Cited

U.S. PATENT DOCUMENTS

| | | | | |
|---|---|---|---|---|
| 2013/0146785 A1* | 6/2013 | Gilissen | ............ | H01L 21/68735 |
| | | | | 250/453.11 |
| 2014/0253900 A1* | 9/2014 | Cornelissen | ........ | G03F 7/70875 |
| | | | | 355/72 |
| 2018/0321602 A1 | 11/2018 | Lafarre et al. | | |

FOREIGN PATENT DOCUMENTS

| | | | |
|---|---|---|---|
| JP | 2002001778 A | | 1/2002 |
| JP | 2014133310 A | | 7/2014 |
| JP | 2016-66791 A | | 4/2016 |
| JP | 2016066791 | * | 4/2016 |
| JP | 2017100376 A | | 6/2017 |
| KR | 20180044819 A | | 5/2018 |

OTHER PUBLICATIONS

English language translation of JP 2016066791 (Year: 2016).*

* cited by examiner

*Primary Examiner* — Larry W Thrower
(74) *Attorney, Agent, or Firm* — Canon U.S.A., Inc. IP Division

(57) ABSTRACT

An imprinting method for forming a pattern on a substrate with use of a mold, includes performing a running-in process in which the mold is brought into contact with a composition on a first substrate held by a holding unit, the composition on the first substrate is exposed, and the mold is released. After the running-in process, the method includes performing an imprinting process in which the mold is brought into contact with a composition on a second substrate, the composition on the second substrate is exposed, the mold is released, and the pattern is formed on the composition on the second substrate. A base material of the first substrate is higher in heat conductivity than a base material of the second substrate. The second substrate is used as an imprint mold.

11 Claims, 7 Drawing Sheets

51

7

61

IMPRINTING METHOD AND MANUFACTURING METHOD

CROSS-REFERENCE TO RELATED APPLICATIONS

This application is a divisional of U.S. application Ser. No. 16/279,676, filed Feb. 19, 2019, which claims the benefit of Japanese Patent Application No. 2018-035311, filed Feb. 28, 2018, which is hereby incorporated by reference herein in its entirety.

BACKGROUND

Field

The present disclosure relates to an imprinting method and a manufacturing method.

Description of the Related Art

An imprinting technology, in which an uncured resin (composition or imprint material) applied on a substrate is molded by a mold (or template) to form a resin pattern on the substrate, has attracted attention. An example of imprinting technique is a photocuring method. In the photocuring method, a photocurable resin is first applied on a shot region that is an imprint region on the substrate. Next, the resin is molded by a mold. Thereafter, light, for example, ultraviolet rays are applied to cure the resin, and the mold and the resin are separated from each other to form a resin pattern on the substrate.

Further, there is also a known method in which a number of replica molds are manufactured from a mold called a master mold with use of the imprinting technology, and articles, such as semiconductor devices, are manufactured from the replica molds. Using the method makes it possible to manufacture replica molds at low cost. Thus, even if the replica mold is broken, it is possible to reduce manufacturing costs.

When the mold and the cured resin are separated from each other in the imprinting, a high separating force causes breakage of the mold, resulting in defect of the molded pattern. Therefore, the separating force is desirably reduced. Japanese Patent Application Laid-Open No. 2016-66791 discusses a method in which, before imprinting is performed on a substrate to be a replica mold, imprinting is performed on a running-in substrate on which a resin containing a mold releasing agent has been applied, to improve mold releasability.

A chromium film is provided in a region, where the pattern is to be formed, of the running-in substrate discussed in Japanese Patent Application Laid-Open No. 2016-66791. When the chromium film is provided, a part of light applied to the resin in the imprinting does not pass through the chromium film and is absorbed by the chromium film as heat energy. When the heat absorbed by the chromium film is transferred to a master mold through heat conduction, the temperature of the master mold rises by the heat and accordingly the master mold deforms. In a case where the imprinting is performed on the substrate to be a replica mold with use of the thermally-deformed master mold, abnormality of the pattern formed on the substrate, such as misalignment and distortion, occurs. To avoid such an issue, the imprinting is performed in a state where influence of thermal deformation is reduced after waiting until the temperature of the master mold decreases. If the temperature rise in the master mold is large, the waiting time becomes long, which causes low throughput.

SUMMARY

According to an aspect of the present disclosure, an imprinting method to form a pattern on a substrate with use of a mold, includes performing a running-in process in which the mold is brought into contact with a first composition on a first substrate held by a holding unit, the first composition on the first substrate is exposed, and the mold is separated from the composition on the first substrate, and performing, after the running-in process, an imprinting process in which the mold is brought into contact with a second composition on a second substrate, the second composition on the second substrate is exposed, the mold is separated from the second composition on the second substrate, and the pattern is formed on the second composition on the second substrate. A first base material of the first substrate is higher in heat conductivity than a second base material of the second substrate. The second substrate is configured as an imprint mold.

Further features of the present disclosure will become apparent from the following description of exemplary embodiments with reference to the attached drawings.

DESCRIPTION OF THE EMBODIMENTS

Exemplary embodiments are described in detail below with reference to accompanying drawings.

First, an imprint apparatus to which an imprinting method is applied according to a first exemplary embodiment is described. The imprint apparatus molds an uncured resin (composition or imprint material) on a substrate using a mold (or template) to form a resin pattern on the substrate.

The imprint apparatus according to the present exemplary embodiment can be used to manufacture articles, such as semiconductor devices, from a pattern formed on a wafer as the substrate. The imprint apparatus is also used to manufacture replica molds with use of a replica mold substrate (blank mold) as the substrate. The imprint apparatus can be used as a dedicated apparatus to manufacture replica molds. In this case, the replica mold can be manufactured in parallel with manufacturing of articles, such as semiconductor devices, without stopping other imprint apparatus used to manufacture articles, such as semiconductor devices. This makes it possible to improve productivity of articles.

The "replica mold" is a mold that has been manufactured based on the pattern portion included in a master mold and includes the pattern portion in the same shape as the master mold. The master mold is manufactured through drawing for a long time by an electron beam drawing apparatus. The master mold is expensive, whereas the replica mold can be manufactured in a large quantity at low cost.

The "blank mold" is a working substrate that is not provided (processed) with the pattern portion but includes a protrusion (transferred portion) having a flat and smooth surface. When the pattern portion is formed on the protrusion, the blank mold becomes a replica mold.

Figure 1:
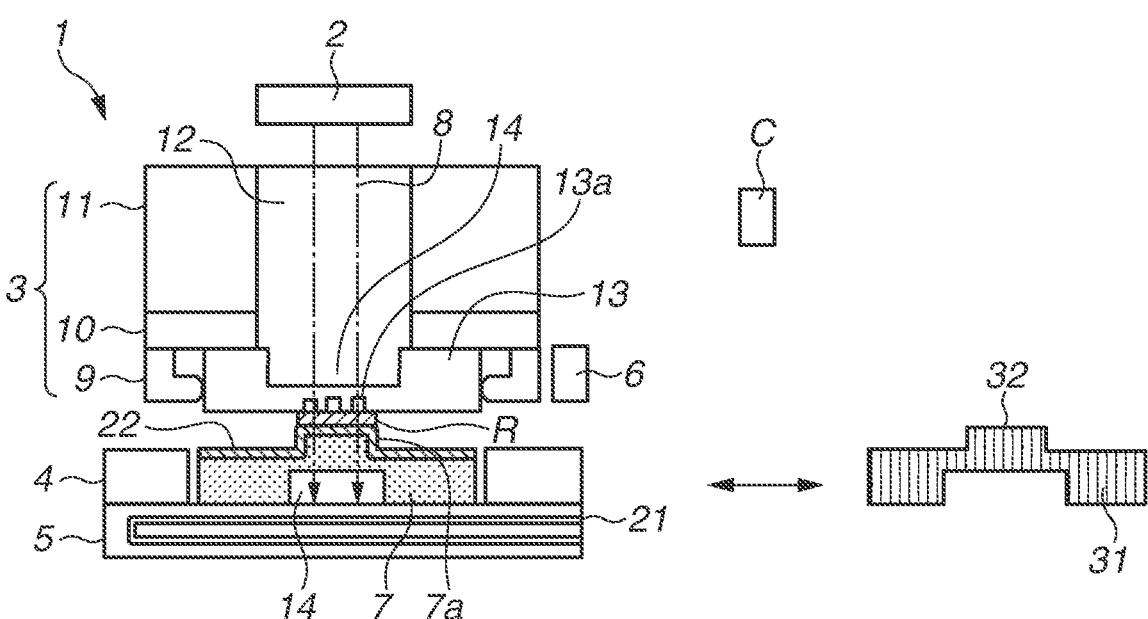
FIG. 1 is a schematic diagram illustrating an imprint apparatus.
Figure 1:
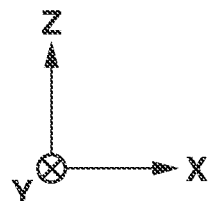

FIG. 1 is a cross-sectional view schematically illustrating the imprint apparatus according to the first exemplary embodiment. A photocuring method is adopted as the imprinting method. In FIG. 1, an axis parallel to an optical axis of light (optical system) applied to a resin R on a blank mold 7 is referred to as Z axis, and axes that are orthogonal to each other in a plane perpendicular to the Z axis are referred to as an X axis and a Y axis. The imprint apparatus 1 includes a light application unit 2, a mold holding mechanism 3, a stage 4, a coating unit 6, and a control unit C.

The light application unit 2 applies ultraviolet rays 8 to the blank mold 7 in order to cure the resin R. The light application unit 2 includes a light source and an optical device that adjusts the ultraviolet rays 8 emitted from the light source to light suitable for curing the resin R. In the present exemplary embodiment, the light application unit 2 is provided to adopt the photocuring method. For example, in a case where a heat-curing method is adopted, a heat source unit to cure a thermosetting resin R is provided in place of the light application unit 2.

A master mold 13 is placed on a mold chuck 10 of the mold holding mechanism 3. The master mold 13 includes, on its surface, a pattern portion 13a in which a pattern to be transferred to a protrusion 7a of the blank mold 7 is formed (processed). As a material of the master mold 13, quartz that allows ultraviolet rays to pass therethrough can be used. The master mold 13 further includes an alignment mark in a part of a region around the pattern portion 13a on the surface. The alignment mark enables determination of a position of the pattern portion 13a. Although it is sufficient if the master mold 13 has at least one alignment mark, it is desirable to provide one alignment mark at each of four corners of the pattern portion 13a in order to determine the position of the pattern portion 13a with higher accuracy.

The mold holding mechanism (holding unit) 3 includes the mold chuck 10 that holds the master mold 13, and a mold driving mechanism 11 that movably holds the mold chuck 10. The mold chuck 10 can hold the master mold 13 by attracting an outside region on a surface on the light application unit 2 side of the master mold 13 with vacuum attraction force or electrostatic force. For example, in a case where the mold chuck 10 holds the master mold 13 using vacuum attraction force, the mold chuck 10 is connected to a vacuum pump (not illustrated) disposed outside, and holding/releasing of the master mold 13 is switched by ON/OFF of the vacuum pump. In addition, the mold chuck 10 and the mold driving mechanism 11 include an opening region 12 at a center part (inside) in order to apply the ultraviolet rays 8 emitted from the light application unit 2 to the blank mold 7 placed on the stage 4. A light transmissive member (not illustrated) (e.g., glass plate) that seals a space surrounded by a part of the opening region 12 and the master mold 13 is disposed in the opening region 12. In addition, pressure inside the space is controlled by a pressure control apparatus including a vacuum pump, etc. The pressure control apparatus sets the pressure inside the space to be higher than the pressure of the outside, for example, when the master mold 13 and the uncured resin R on the blank mold 7 are pressed toward one another. The pattern portion 13a is bent in a protruded shape toward the blank mold 7 and is brought into contact with the uncured resin R from the center part of the pattern portion 13a. This prevents gas (air) from being enclosed between the pattern portion 13a and the uncured resin R, and the pattern portion 13a can be entirely filled with the uncured resin R. To facilitate the above-described deformation of the pattern portion 13a, the master mold 13 may have a shape in which a cavity 14 (recess) having a circular planar shape and a predetermined depth is provided on the surface irradiated with the ultraviolet rays 8. The cavity 14 can be provided near the center of the master mold 13. A cross-sectional view of the master mold 13 is illustrated in FIG. 1.

Further, the mold holding mechanism 3 may include a magnification correction mechanism 9 on the side on which the mold chuck 10 holds the master mold 13. The magnification correction mechanism 9 applies external force or displacement to a side surface of the master mold 13, thereby correcting the shape of the master mold 13 (pattern portion 13a). In a case where the master mold 13 has an excellent shape and correction is unnecessary, the magnification correction mechanism 9 may not be provided.

The mold driving mechanism 11 moves the master mold 13 in each of the axis directions in order to perform pressing operation or separating operation between the master mold 13 and the blank mold 7. The mold driving mechanism 11 may be a single driving system, or a combination of a coarse-motion driving system and a fine-motion driving system that performs positioning more precise than the coarse-motion driving system. In a case of the single driving system, the driving system performs driving in at least the Z axis direction. In a case of the combination of the coarse-motion driving system and the fine-motion driving system, the coarse-motion driving system mainly performs long-distance driving in the Z axis direction, and the fine-motion driving system performs driving in a minute range in, for example, six axis (X, Y, Z, $\omega$x, $\omega$y, and $\omega$z) directions following the coarse-motion driving system. Examples of an actuator adoptable in these driving systems include a linear motor and an air cylinder. The pressing operation and the separating operation in the imprint apparatus 1 is realized by movement of the master mold 13 in the Z axis direction. Alternatively, the pressing operation and the separating operation may be realized by movement of the stage 4 in the Z axis direction or by relative movement of the master mold 13 and the stage 4.

The stage 4 holds the blank mold 7, and performs positioning of the master mold 13 and the blank mold 7 when the master mold 13 is pressed against the uncured resin R on the blank mold 7. The stage 4 includes a chuck 5 that holds the blank mold 7 using attraction force, and an unillustrated stage driving mechanism that holds the chuck 5 by a mechanical unit so as to be movable in each of the axis directions. The stage driving mechanism may be a single driving system, or a combination of a coarse-motion driving system and a fine-motion driving system. In a case of the single driving system, the driving system performs driving in at least a plane direction (horizontal direction) by the X axis and the Y axis. In a case of the combination of the coarse-motion driving system and the fine-motion driving system, the coarse-motion driving system mainly performs long-distance driving in the plane direction by the X axis and the Y axis, and the fine-motion driving system performs driving in a minute range in, for example, six axis (X, Y, Z, $\omega$x, $\omega$y, and $\omega$z) directions following the coarse-motion driving system. Examples of an actuator adoptable in these driving systems include a linear motor and a planar motor.

A flow path 21 through which temperature-controlled fluid flows is provided in the chuck 5 in order to control temperature of the blank mold 7. The flow path 21 is connected to a temperature control apparatus, the temperature of the fluid is controlled by the temperature control apparatus, and the temperature-controlled fluid flows through the flow path 21. The temperature of the blank mold 7 can be actively or passively controlled to a predetermined temperature by an unillustrated temperature sensor and an unillustrated controller. For example, the temperature of the blank mold 7 can be controlled so as to be equal to the temperature of the master mold 13. In addition, heat absorbed by the blank mold 7 when the blank mold 7 is irradiated with (exposed to) the ultraviolet rays 8 can be cooled by the chuck 5. A material with high heat conductivity, for example silicon carbide (SiC), can be used. When the material with high heat conductivity is used for the chuck 5, it is advantageous in terms of heat transfer, which enables efficient control of the temperature of the blank mold 7. Such a configuration of the chuck 5 enables improvement in a transfer magnification of a pattern and a positional accuracy of the pattern.

The blank mold 7 (second substrate) is disposed as the working substrate on the chuck 5. As described above, the blank mold 7 is a constituent member that includes the protrusion 7a on which a pattern portion (protrusion and recess) is not provided and subsequently becomes the replica mold. A plane size of the protrusion 7a is, for example, 26 mm×33 mm, and a thickness (height) of the protrusion 7a is, for example, 30 μm from a non-protruded surface (surface other than protrusion) around the protrusion 7a. Quarts can be used as the material of the blank mold 7 as with the master mold 13. As the material of the blank mold 7, a transparent material such as glass other than quartz and a resin may be used. To facilitate etching after the pattern is formed on the protrusion 7a by the imprint apparatus 1, a chromium film 22 may be formed on a surface, on which the resin is to be provided, of the blank mold 7. In a case where the film is formed on the blank mold 7, the material of the blank mold 7 includes a main material (base material), such as quartz, glass, and a resin, and a film provided on the base material. Further, to promote adhesion of the resin R on which the pattern portion is formed, an adhesive agent containing, for example, an organic chemical compound (coating) is desirably applied on the surface of the protrusion 7a. Further, the cavity 14, as provided in the master mold 13, can be provided in the blank mold 7. A cross-sectional view of the blank mold 7 is illustrated in FIG. 1.

The coating unit 6 is disposed near the mold holding mechanism 3 and applies the uncured resin R on the blank mold 7. The resin R is a photocurable resin R that is curable by receiving the ultraviolet rays 8 and is appropriately selected depending on various kinds of conditions of a semiconductor device manufacturing process, a replica mold manufacturing process, etc. The coating unit 6 can adopt, for example, a liquid droplet ejection system (drop method). An amount of resin R ejected from an unillustrated ejection nozzle is appropriately determined depending on a desired thickness of the resin R formed on the blank mold 7, density of a pattern to be formed, etc. In addition, the resin R can include a mold releasing agent. This improves mold releasability to release the resin R from the protrusion and recess of the pattern portion 13a of the master mold 13. With use of such an effect of the mold releasing agent, running-in imprinting to apply the mold releasing agent mixed in the resin R to the pattern portion 13a is performed after the master mold 13 is washed, before imprinting is performed with use of the master mold 13 and the blank mold 7 for the first time, or periodically. In the running-in imprinting (running-in process), a resin on a running-in substrate 31 (first substrate) for running-in imprinting and the master mold 13 are brought into contact with each other, the resin on the running-in substrate 31 is exposed, and the resin on the running-in substrate 31 and the master mold 13 are separated from each other. As a result, the mold releasing agent mixed in the resin R is applied to the pattern portion 13a. A cross-sectional diagram of the running-in substrate 31 is illustrated in FIG. 1.

Figure 6:
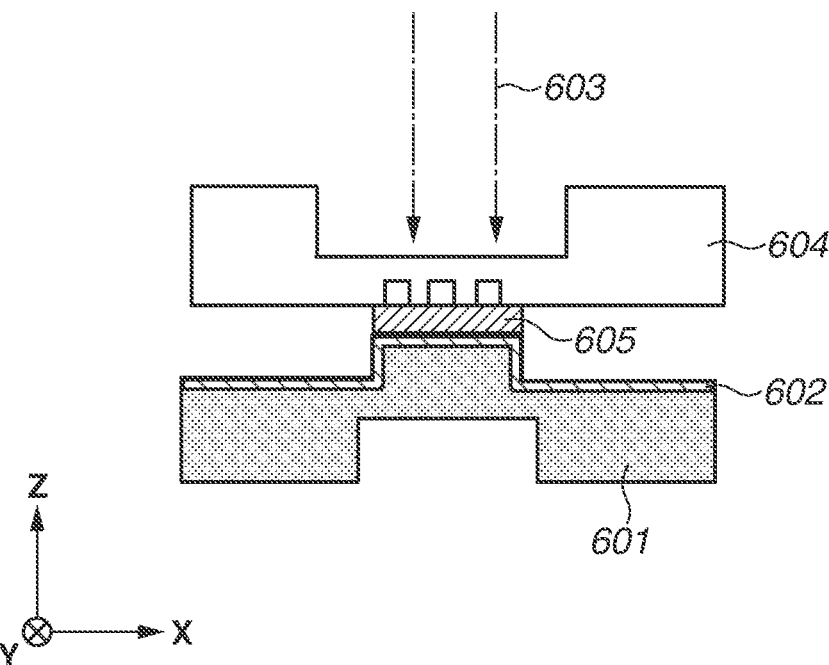
FIG. 6 is a diagram illustrating a state of running-in imprinting using a running-in substrate.

A case where quartz with a chromium film formed thereon, similarly to the material of the blank mold 7 as the working substrate, is used as the material of the running-in substrate is considered. FIG. 6 is a diagram illustrating the running-in imprinting using a running-in substrate 601 with a chromium film 602 formed thereon. In the running-in imprinting, a resin 605 is spread over a pattern region of a master mold 604 by imprinting operation. When the spread resin 605 is exposed to ultraviolet rays 603, a part of the light does not pass through the chromium film 602 and is absorbed as heat energy by the chromium film 602. Since the master mold 604 is in contact with the resin 605 on the chromium film 602, the heat absorbed by the chromium film transfers to the master mold 604 through heat conduction. As a result, the master mold 604 deforms by the heat. The heat conductivity of quartz is low, so that the heat absorbed by the chromium film 602 is hardly transferred to the base material (quartz) of the running-in substrate 601 and is hardly transferred to the chuck 5 on the stage 4. In a case where imprinting is performed on the substrate 601 with use of the thermally-deformed master mold 604, abnormality, such as positional deviation and distortion, of the pattern formed on the substrate 601 occurs. Accordingly, the imprinting is performed in a state where influence of thermal deformation is reduced after waiting until the temperature of the master mold 604 decreases. If the temperature rise of the master mold 604 is large, a waiting time before a next imprinting process using the master mold 604 becomes long.

Accordingly, in the present exemplary embodiment, a material different from the material (base material) of the blank mold 7 for substrate processing is used as the material (base material) of the running-in substrate 31. The base material of the blank mold 7 as the working substrate is a material with low heat conductivity, such as quartz, glass, and a resin. As the base material of the running-in substrate 31, for example, a metal with high heat conductivity, such as aluminum, is selectable. The heat conductivity of quartz is 1.38 W/m·K, and the heat conductivity of aluminum is 237 W/m·K. In the running-in imprinting, the heat energy that is absorbed by the running-in substrate 31 from the ultraviolet rays 8 is transferred to an inside of the running-in substrate 31 that has heat conductivity higher than the heat conductivity of the master mold 13 containing quartz and is transferred to the chuck 5 that holds the substrate. The heat transferred to the chuck 5 is discharged by the temperature-controlled fluid flowing through the flow path 21. As a result, it is possible to suppress temperature rise of the master mold 13 that is in contact with the resin on the running-in substrate 31 when the resin is exposed in the running-in imprinting. This, thus, makes it possible to suppress thermal deformation of the master mold 13.

As the base material of the running-in substrate 31, a material with heat conductivity higher than the heat conductivity of the base material of the blank mold 7 can be used. As the base material of the running-in substrate 31, for example, carbon nanotube, diamond, silver, copper, gold, or ceramic may be appropriately selected. The state where the film is not formed on the running-in substrate 31 has been described; however, a surface of a protrusion 32 (base material) of the running-in substrate 31 may be coated with a chromium film (metal film) in order to protect the pattern portion 13a of the master mold 13. This makes it possible to reduce dimensional variation due to shaving of the pattern portion 13a and to reduce reverse transfer of a shaved part of the base material of the running-in substrate 31 to the pattern portion 13a.

The imprint apparatus 1 includes the control unit C that controls operation of and adjusts the components, and can execute control of each component based on a program, etc. In addition, the imprint apparatus 1 may include a measurement system (alignment scope) to align the mold and the substrate. The imprint apparatus 1 may further include a mold conveyance mechanism that conveys the master mold 13 from outside of the apparatus to the mold holding mechanism 3 and a substrate conveyance mechanism that conveys the blank mold 7 from outside of the apparatus to the stage 4. In particular, the measurement system observes (detects) the alignment mark of the master mold 13 placed on the mold holding mechanism to determine the position of the pattern portion 13a. In the configuration of the imprint apparatus, various modifications may be made. For example, a plurality of stages 4 can be mounted, one stage 4 can hold a plurality of the blank molds 7, or a plurality of the coating units 6 can be mounted.

Figure 2:
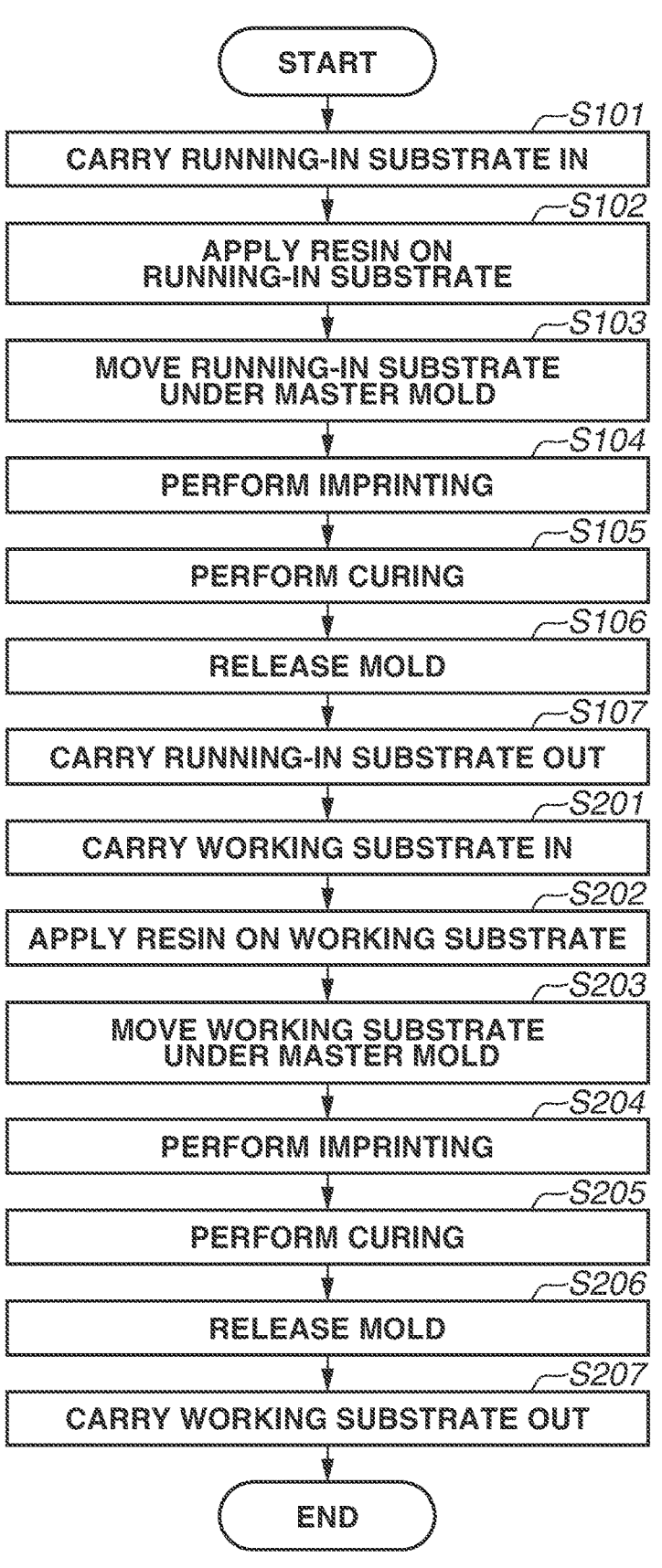
FIG. 2 is a flowchart illustrating an imprinting method.

Next, the imprinting method according to the present exemplary embodiment is described. FIG. 2 is a flowchart of the imprinting method according to the present exemplary embodiment. Each step is processed by the control unit C of the imprint apparatus 1, or executed by any of the components of the imprint apparatus 1 based on an instruction from the control unit C.

In step S101, the conveyance mechanism carries the master mold 13 and the running-in substrate 31 into the imprint apparatus 1 based on the instruction from the control unit C. The mold chuck 10 holds the master mold 13, and the chuck 5 of the stage 4 holds the running-in substrate 31. In step S102, the stage 4 moves the running-in substrate 31 to a position where the protrusion 32 of the running-in substrate 31 face the coating unit 6, and the coating unit 6 supplies an uncured resin to the protrusion 32. In step S103, the stage 4 moves the running-in substrate 31 to a position facing the master mold 13.

In step S104, the mold driving mechanism 11 moves the master mold 13 downward to perform imprinting operation. When the pattern portion 13a and the resin are brought into contact with each other, filling of the pattern portion 13a with the resin is started. In step S105, the light application unit 2 applies the ultraviolet rays 8 to the resin to cure the resin, thereby forming a pattern of the cured resin. In step S106, the mold driving mechanism 11 moves the master mold 13 upward to separate/release the master mold 13 from the resin.

By the above-described steps, the uneven surface of the pattern portion 13a of the master mold 13 is coated with the mold releasing agent mixed in the resin R. The material of the running-in substrate 31 is different from the material of the working substrate according to the present exemplary embodiment. As described above, heat is hardly transferred to the master mold 13 in the running-in imprinting, and dimension variation of the master mold 13 is accordingly small. Thus, the waiting time until the temperature of the master mold decreases is short, which allows for immediate transition to the next imprinting process using the master mold 13.

In step S107, the conveyance mechanism carries the running-in substrate 31 out of the imprint apparatus 1 after the master mold 13 and the resin R are separated from each other. The running-in substrate 31 carried out of the imprint apparatus 1 is repeatedly usable by performing processing, such as washing processing, to remove the resin R. A washer may be provided inside the imprint apparatus 1. In this case, it is unnecessary to separately provide the washer and it is possible to reduce a time necessary for carrying the substrate out of the imprint apparatus 1 and carrying the substrate in the imprint apparatus 1 again. This makes it possible to further improve throughput.

Next, in step S201, the conveyance mechanism carries the blank mold 7 as the working substrate into the imprint apparatus 1, based on the instruction from the control unit C. The chuck 5 of the stage 4 holds the blank mold 7. In step S202, the stage 4 moves the blank mold 7 to a position where the protrusion 7a of the blank mold 7 faces the coating unit 6, and the coating unit 6 supplies an uncured resin R to the protrusion 7a.

Next, in step S203, the stage 4 moves the blank mold 7 to a position facing the master mold 13. In step S204, the mold driving mechanism 11 moves the master mold 13 downward to perform imprinting operation. When the pattern portion 13a and the resin R are brought into contact with each other, filling of the pattern portion 13a with the resin R is started. In step S205, the light application unit 2 applies the ultraviolet rays 8 to the resin R on the blank mold 7 to cure the resin R, thereby forming the pattern of the cured resin R. Next, in step S206, the mold driving mechanism 11 moves the master mold 13 upward to separate/release the master mold 13 from the resin R.

By the above-described steps, the uneven structure same as the pattern portion 13a of the master mold 13 is transferred to the resin R on the protrusion 7a of the blank mold 7 with high accuracy. In step S207, the conveyance mechanism carries the blank mold 7 out of the imprint apparatus 1 after the master mold 13 and the resin R are separated from each other. The mold on which the pattern has been formed on the protrusion by the above-described imprinting method is carried to the outside of the imprint apparatus 1, the pattern portion is then subjected to a final process by other manufacturing apparatus, and the blank mold is manufactured as a mold.

Figure 5:
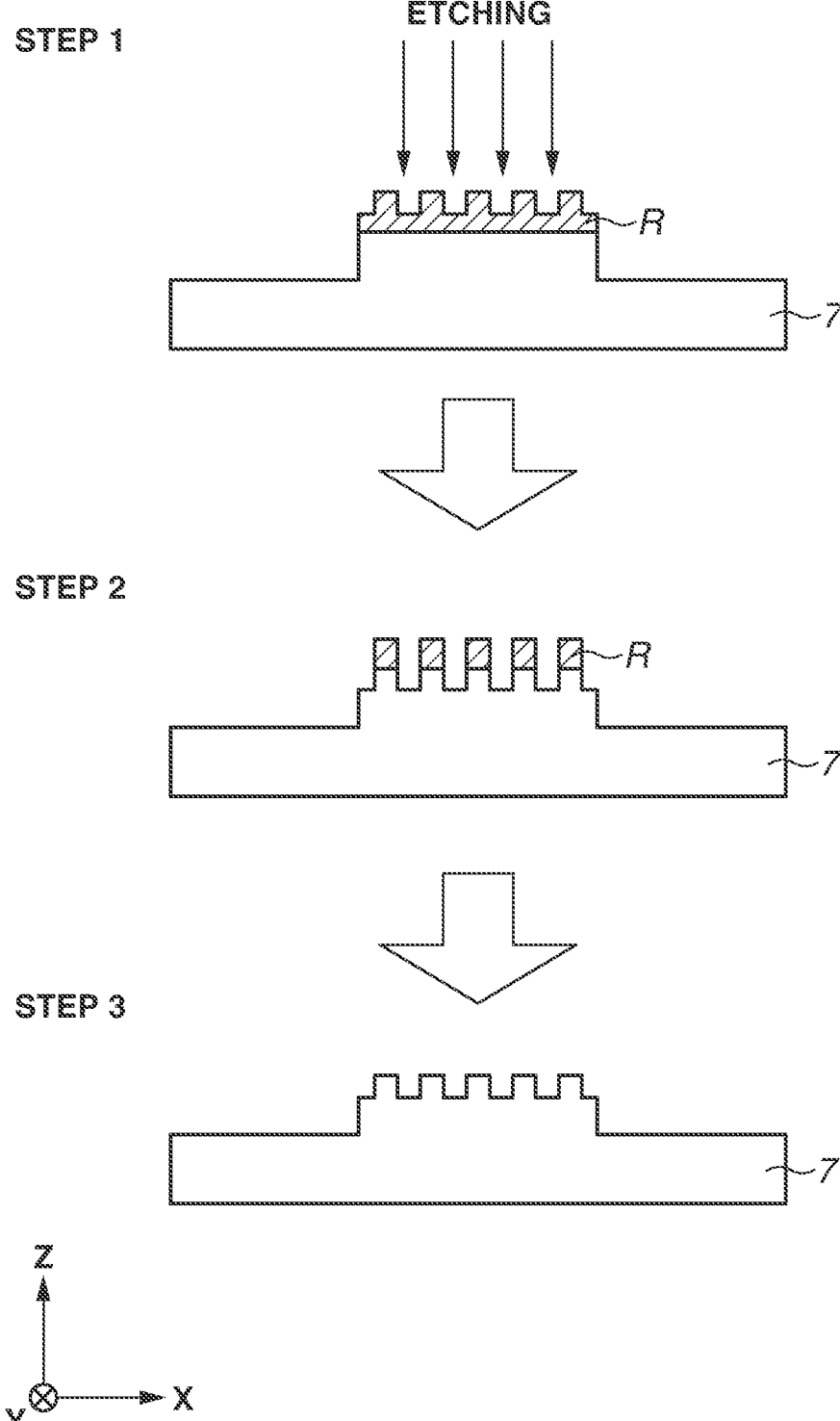
FIG. 5 is a schematic diagram illustrating a working process of a pattern portion of a blank mold.

FIG. 5 is a schematic diagram illustrating operation in the final process on the pattern portion of the blank mold. First, etching is performed on a resin layer (resin R) on the blank mold 7 on which the pattern has been formed by the imprint apparatus 1 (STEP 1). After the etching is performed (STEP 2), the remaining resin R is removed by removing processing (washing processing) (STEP 3). As a result, the replica mold is completed.

According to the present exemplary embodiment, in the running-in imprinting, the heat energy absorbed by the running-in substrate 31 from the ultraviolet rays 8 is transferred toward the chuck 5 and the running-in substrate that has the heat conductivity higher than the heat conductivity on the master mold 13 side. The heat transferred to the chuck 5 is discharged by the temperature-controlled fluid flowing through the flow path 21. As a result, it is possible to reduce temperature rise in the master mold 13 when the imprinting is performed on the running-in substrate. In other words, it is possible to reduce the thermal deformation amount of the master mold 13 after the running-in imprinting. This makes it possible to reduce the waiting time until imprinting using the master mold 13 and the working substrate (blank mold) after the running-in imprinting. Accordingly, the number of replica molds manufactured per unit time, i.e., throughput, can be improved.

A second exemplary embodiment is described below. The running-in substrate in the imprinting method according to the second exemplary embodiment is different from the running-in substrate according to the first exemplary embodiment. The other configurations are similar to those in the first exemplary embodiment, and description of the configurations is omitted.

Figure 3:
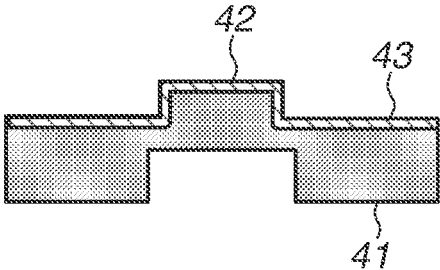
FIG. 3 is a cross-sectional view illustrating a running-in substrate according to a second exemplary embodiment.

FIG. 3 is a cross-sectional view of a running-in substrate 41 according to the second exemplary embodiment. In the running-in substrate 41, a reflective film 43 is provided on a surface that includes a protrusion 42 and is to face the master mold 13, i.e., a surface on which a resin is to be applied. As the reflective film 43, a metal film corresponding to a wavelength of light curing the resin is appropriately selected and provided. For example, an aluminum film (aluminum coating) may be adopted as the metal film to enhance reflectivity to the ultraviolet rays. As the base material of the running-in substrate 41, glass, a resin, or a metal may be used, or aluminum according to the first exemplary embodiment may be also used.

The blank mold 7 as the working substrate is similar to the blank mold 7 according to the first exemplary embodiment. In a case where a chromium film is formed on the blank mold 7, the reflective film 43 is made higher in reflectivity than the chromium film of the blank mold 7. As a result, the reflective film 43 reflects the light curing the resin, so that heat absorbed by the reflective film 43 is reduced. In other words, in the running-in imprinting, the reflectivity of the reflective film 43 of the running-in substrate 41 with respect to the ultraviolet rays 8 is improved as compared with the case where a chromium film is provided on the running-in substrate 41. Accordingly, the heat energy absorbed by the reflective film 43 from the ultraviolet rays 8 is reduced, and the temperature rise of the reflective film 43, i.e., the temperature rise of the running-in substrate 41, is suppressed.

When the temperature rise of the running-in substrate 41 is suppressed, it is possible to reduce heat transferred from the running-in substrate 41 to the master mold 13, thereby suppressing the temperature rise of the master mold 13 that is in contact with the running-in substrate 41 in the running-in imprinting. Thus, thermal deformation of the master mold 13 is small, and the waiting time until the temperature the master mold 13 decreases is short, which allows for immediate transition to the next process. This makes it possible to improve throughput.

A third exemplary embodiment is described below. A running-in substrate in the imprinting method according to the third exemplary embodiment is different from the running-in substrate according to the first exemplary embodiment. The other configurations are similar to those in the first exemplary embodiment, and description of the configurations is omitted. A chromium film is provided on the blank mold 7 according to the present exemplary embodiment.

Figure 4:
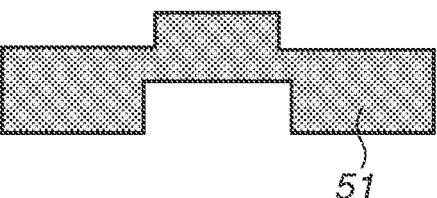
FIG. 4 is a cross-sectional view illustrating a running-in substrate according to a third exemplary embodiment.

FIG. 4 is a cross-sectional view illustrating a running-in substrate 51 according to the third exemplary embodiment. A base material of the running-in substrate 51 is the same as the base material of the blank mold 7. As the base material, glass or a resin is used. A chromium film is not provided on the running-in substrate 51. A transmittance of the base material of the running-in substrate 51 is higher than the transmittance of the base material of the blank mold 7, or the running-in substrate 51 may have a surface state with a higher transmittance. For example, high-purity quartz that has a transmittance higher than or equal to 92% can be used for the base material of the running-in substrate 51. Further, since the running-in substrate 51 desirably has a high transmittance, a material and surface treatment may be combined to achieve a higher transmittance.

As a result, the transmittance of the running-in substrate 51 with respect to the ultraviolet rays 8 in the running-in imprinting is improved as compared with the case where a chromium film is provided on the running-in substrate 51. This reduces the heat energy absorbed by the running-in substrate 51 from the ultraviolet rays 8, thereby suppressing temperature rise of the running-in substrate 51.

When the temperature rise of the running-in substrate 51 is suppressed, it is possible to reduce the heat transferred from the running-in substrate 51 to the master mold 13 and also to suppress the temperature rise of the master mold 13 that is in contact with the running-in substrate 51 in the running-in imprinting. Thus, thermal deformation of the master mold 13 is small, and the waiting time until the temperature of the master mold 13 decreases is short, which allows for immediate transition to the next process. This makes it possible to improve throughput.

A fourth exemplary embodiment is described below. In the present exemplary embodiment, a modification of the running-in substrate that is applicable to the above-described exemplary embodiments is described. In the running-in substrate and the blank mold 7 in the above-described exemplary embodiments, the respective surfaces to be held by the chuck 5 on the stage 4 have the same shape and the same area. In the present exemplary embodiment, the running-in substrate and the blank mold 7 are different from each other in the shape and the area of the surface to be held by the chuck 5. More specifically, in the running-in substrate, the area of the surface to be held by the chuck 5 is larger than that of the blank mold 7.

Figure 7:
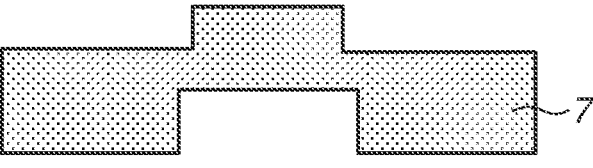
FIG. 7 is a diagram illustrating a blank mold and a running-in substrate, which are disposed next to each other, according to a fourth exemplary embodiment.
Figure 7:
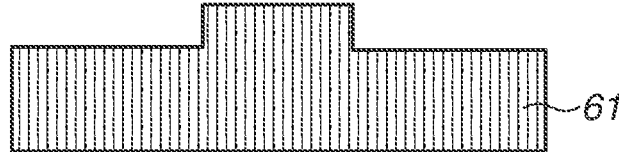

FIG. 7 is a diagram illustrating a cross-sectional view of the blank mold 7 and a cross-sectional view of a running-in substrate 61 according to the fourth exemplary embodiment side by side. The base material of the blank mold 7 is glass, a resin, or a metal, and a chromium film is not provided thereon. In the blank mold 7, a recess (i.e., space or cavity) is provided on the surface to be held by the chuck 5 on the stage 4. In the running-in substrate 61, a space (cavity) is not provided on the surface to be held by the chuck 5, and the surface to be held by the chuck 5 is a flat surface. The area of the surface, which is to be held by the chuck 5, of the running-in substrate 61 is larger than that of the blank mold 7.

According to the present exemplary embodiment, a contact area between the chuck 5 and the running-in substrate 61 is large. This makes it possible to efficiently transfer, to the chuck 5, heat energy that is absorbed by the running-in substrate 61 from the ultraviolet rays 8 in the running-in imprinting. The heat transferred to the chuck 5 is discharged by the temperature-controlled fluid flowing through the flow path 21. As a result, it is possible to suppress temperature rise of the master mold 13 in the running-in imprinting. In other words, it is possible to reduce the thermal deformation amount of the master mold 13 after the running-in imprinting. Accordingly, the waiting time before the imprinting using the working substrate after the running-in imprinting can be reduced. This makes it possible to improve throughput. The surface, which is to be held by the chuck 5, of the running-in substrate 61 is not limited to the flat surface, and may include a recess or a protrusion.

[Article Manufacturing Method]

A method for manufacturing a device (e.g., semiconductor integrated circuit (IC) device, liquid crystal display device, color filter, and micro-electronic mechanical system (MEMS)) as an article is described.

First, the running-in imprinting is performed using the above-described imprint apparatus and method to form a pattern on a blank mold, thereby manufacturing a replica mold. The article manufacturing method includes a step of forming the pattern on a substrate (e.g., wafer, glass plate, or film substrate) with use of the manufactured replica mold as a mold in the imprint apparatus. Further, the manufacturing method may include a step of performing etching with use of the formed pattern as a mask. In a case where other articles, such as a patterned medium (recording medium) and an optical device, are manufactured, the manufacturing method may include other process for processing the substrate with the pattern formed thereon, in place of the etching. Moreover, the manufacturing method includes dicing, bonding, packaging, etc. The article manufacturing method according to the present exemplary embodiment is advantageous in at least one of performance, quality, productivity, and a production cost of the article as compared with existing methods.

Although the exemplary embodiments have been described above, the present disclosure is not limited to these exemplary embodiments and can be variously modified or alternated within the scope of the present disclosure. For example, the case where each of the exemplary embodiments is applied to the replica mold manufacturing apparatus using the blank mold as a working substrate (second substrate) has been described; however, each of the exemplary embodiments is applicable to an imprint apparatus as a device manufacturing apparatus using, as the second substrate, a substrate for manufacturing a device, etc.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An imprinting method for forming a pattern on a substrate with use of a master mold, the imprinting method comprising:

performing a running-in process in which the master mold is brought into contact with a first composition on a first substrate held by a holding unit, the first composition on the first substrate is exposed, and the master mold is separated from the first composition on the first substrate; and performing, after the running-in process, an imprinting process in which the master mold is brought into contact with a second composition on a second substrate held by the holding unit, the second composition on the second substrate is exposed, the master mold is separated from the second composition on the second substrate, and the pattern is formed on the second composition on the second substrate, wherein a first base material of the first substrate is same as a second base material of the second substrate, and a transmittance of the first base material of the first substrate is higher than a transmittance of the second base material of the second substrate, wherein the second substrate includes a metal film formed on a surface on which the second composition is to be provided, wherein the first substrate does not include a metal film formed on a surface on which the first composition is to be provided, wherein the second substrate is configured as a replica mold, and wherein an entire area of a first surface of the first substrate that comes into contact with the holding unit holding the first substrate is larger than an entire area of a second surface of the second substrate that comes into contact with the holding unit holding the second substrate.

2. The imprinting method according to claim 1, wherein the first substrate is cooled in the exposure in the running-in process.

3. The imprinting method according to claim 2, wherein the first substrate is cooled by a temperature-controlled fluid that flows in the holding unit holding the first substrate.

4. A replica mold manufacturing method by using a master mold, comprising:

performing a running-in process in which the master mold is brought into contact with a first composition on a first substrate held by a holding unit, the first composition on the first substrate is exposed, and the master mold is separated from the first composition on the first substrate; and forming, after the running-in process, a pattern on a second composition on a second substrate to produce the replica mold by contacting the second composition on the second substrate held by the holding unit with the master mold, exposing the second composition on the second substrate, and separating the master mold from the second composition on the second substrate, wherein a first base material of the first substrate is same as a second base material of the second substrate, and a transmittance of the first base material of the first substrate is higher than a transmittance of the second base material of the second substrate, wherein the second substrate includes a metal film formed on a surface on which the second composition is to be provided, wherein the first substrate does not include a metal film formed on a surface on which the first composition is be provided, wherein the replica mold is configured as an imprint mold, and wherein an entire area of a first surface of the first substrate that comes into contact with the holding unit holding the first substrate is larger than an entire area of a second surface of the second substrate that comes into contact with the holding unit holding the second substrate.

5. The replica mold manufacturing method according to claim 4, wherein the first substrate is cooled in the exposure in the running-in process.

6. The replica mold manufacturing method according to claim 5, wherein the first substrate is cooled by a temperature-controlled fluid that flows in the holding unit holding the first substrate.

7. The imprinting method according to claim 1, wherein the first substrate has a surface state with a higher transmittance than a surface state of the second substrate.

8. The imprinting method according to claim 1, wherein the transmittance of the first base material of the first substrate is 92% or higher.

9. The replica mold manufacturing method according to claim 4, wherein a transmittance of the base material of the first substrate is higher than a transmittance of the base material of the second substrate.

10. The replica mold manufacturing method according to claim 4, wherein the first substrate has a surface state with a higher transmittance than a surface state of the second substrate.

11. The replica mold manufacturing method according to claim 4, wherein the transmittance of the first base material of the first substrate is 92% or higher.

* * * * *